United States Patent [19]
Thee et al.

[11] Patent Number: 5,256,973
[45] Date of Patent: Oct. 26, 1993

[54] RELAY TESTER HAVING A CIRCUIT TO SENSE THE VOLTAGE SPIHE CAUSED BY THE ARMATURE MOVEMENT

[76] Inventors: Michael Thee, 1900 Dallas St., Aurora, Colo. 80010; William Shurmantine, 1800 E. Prathersville Rd., Lot 70, Columbia, Mo. 65202

[21] Appl. No.: 723,213
[22] Filed: Jun. 28, 1991
[51] Int. Cl.$^5$ .................... G01R 31/60; G01R 31/00
[52] U.S. Cl. .................... 324/418; 340/644
[58] Field of Search .................. 324/418, 423, 422; 340/644

[56] References Cited

U.S. PATENT DOCUMENTS

| | | | |
|---|---|---|---|
| 3,355,659 | 11/1967 | Burgess | 324/418 |
| 4,319,193 | 3/1982 | Boccali et al. | |
| 4,464,628 | 8/1984 | Nozawa | |
| 4,961,051 | 10/1990 | Tjebben | |

Primary Examiner—Walter E. Snow

[57] ABSTRACT

A computerized relay tester is provided which comprises a bar code reader, a test circuit for determining an actual value of an operational characteristic of the relay, and a memory for storing reference values for the operational characteristic for a plurality of relays. The test circuit is operative to automatically measure the actual voltage or current values at which "pickup" or "drop away" occurs in the relay under test, by sensing an inductive voltage "spike" caused by movement of the relay armature. Based on signals from the bar code reader, a reference value for the particular operational characteristic under test are retrieved from memory. The actual value is then compared with the reference value to determine whether the relay is functioning properly, and the relay tester outputs an indication of the operational state or condition of the relay.

16 Claims, 4 Drawing Sheets

RELAY TESTER HAVING A CIRCUIT TO SENSE THE VOLTAGE SPIHE CAUSED BY THE ARMATURE MOVEMENT

BACKGROUND OF THE INVENTION

1. Field of the Invention

This invention pertains to the field of electrical testing equipment. More particularly, this invention pertains to the field of electrical testing equipment which is used for monitoring and recording the operation and/or performance of electrical relays.

2. Description of Related Art

Various devices have been proposed for testing the operation of electrical relays, as disclosed, for example, in U.S. Pat. Nos. 4,319,193, 4,464,628, and 4,961,051. However, because none of these devices has received wide-spread commercial acceptance, relay testing remains, for the most part, a time consuming and inexact process.

Conventionally, testing of electrical relays is accomplished with devices incorporating an analog meter. Specifically, to test a relay, a source of variable power is connected across the coil of the relay and the source voltage is increased gradually. The analog meter is used to give an indication of the amount of current passing through the coil. When sufficient current is supplied to the coil, the electromagnetic field created by the coil causes the armature of the relay to shift or "pickup" from its original position, thereby closing the relay switch, as is conventional.

Prior to the closing of the relay switch, the gradual increase in the source voltage causes a corresponding gradual rise in the position of the needle of the analog meter. However, as the relay switch closes, the movement of the armature through the coil causes an inductive "spike" which appears on the analog meter as a slight jump. The position of this slight jump on the meter scale is estimated by the operator performing the relay test and gives an indication of the pickup voltage or current necessary to activate the relay switch.

After the pickup voltage or current has been determined and recorded, the power of the power source is then gradually decreased. As the power is decreased, the electromagnetic field created by the current passing through the coil decreases sufficiently to allow the armature to shift or "drop away" back to its original position, thereby causing the relay switch to open. The shifting of the armature as the relay switch opens causes a second "spike" which again appears on the analog meter as a slight jump by the needle on the meter scale. The position on the meter scale of the this second slight jump is again estimated and recorded as an indication of the drop away voltage or current. All in all, the conventional relay testing procedure requires several minutes to complete.

As is readily apparent, the results of this testing procedure may often be characterized by significant degrees of error. In addition to the normal instrument error of the analog meter, estimation and interpretation by the operator of the slight needle jumps may give rise to significant errors. Moreover, the apparent position of the slight needle jumps will often be dependent on the speed at which the source voltage of the power source is increased or decreased. Considering the serious implications which erroneous or inaccurate relay testing procedures might bring, for example, in the railroad signal industry, it would be most desireable to eliminate these and other sources of relay testing errors.

SUMMARY OF THE INVENTION

It is an object of the present invention to provide an electrical relay tester which minimizes the effect of measurement error, and which provides a highly accurate indication of the operation and performance of a relay under test.

It is a further object of the invention to provide a relay tester which is capable of effecting, in a matter of seconds, automatic relay testing procedures to determine the operational state and performance of a relay under test.

Specifically, the invention comprises a relay tester for sensing a shifting of a relay armature in a relay under test. The relay tester includes applying means for applying a ramped, time varying voltage potential to the relay; first signal generating means for generating a first electrical signal representative of an actual voltage potential being developed across the relay while the ramped, time varying voltage potential is being applied; reference signal generating means for modifying the first signal to generate a reference signal, wherein the generated reference signal has a waveform characteristic which both lags a corresponding waveform characteristic of the first signal by a predetermined time period and is greater in amplitude than the corresponding waveform characteristic of the first signal; and voltage spike determining means, responsive to the first electrical signal and the reference electrical signal, for producing an output signal indicative of the shifting of the relay armature when a magnitude of the first electrical signal passes a magnitude of the reference electrical signal, thus indicating an occurrence of an inductive voltage spike.

In other aspects, the invention comprises methods of testing a relay. In particular, according to the invention, the invention comprises the steps of: applying a ramped, time varying voltage potential to the relay; generating a first electrical signal representative of an actual voltage potential being developed across the relay while the ramped, time varying voltage potential is being applied to the relay; generating a reference electrical signal from the first electrical signal by feeding the first electrical signal through a multiplier and a sample-and-hold circuit to produce the reference electrical signal, whereby, in the time domain, a waveform characteristic in the reference electrical signal caused by the shifting of the relay armature lags a corresponding waveform characteristic in the first electrical signal by a predetermined period; producing an output signal indicative of the shifting of the relay armature when the value of the first electrical signal passes the value of the reference electrical signal, thus indicating an occurrence of a voltage spike.

Moreover, the invention pertains to a method of testing a relay employing a barcode reader, wherein the method comprises the steps of: employing the bar code reader to read identifying information from a bar code provided on the relay; connecting the electrical connectors to the relay; testing the relay with the test circuit to determine an actual value of an operational characteristic thereof; retrieving a reference value of the operational characteristic of the relay from the memory of the controller, based on the identifying information read by the bar code reader; comparing the reference value of the operational characteristic with the actual value of the operational characteristic to determine whether the relay is functioning properly; outputting an indication of whether the relay is functioning properly to the output of the relay testing apparatus, whereby a procedure for testing relays is simplified.

However, the invention will best be understood by a review of the following specification in conjunction with the accompanying drawings, in which:

DETAILED DESCRIPTION OF THE PREFERRED EMBODIMENT

Figure 1:
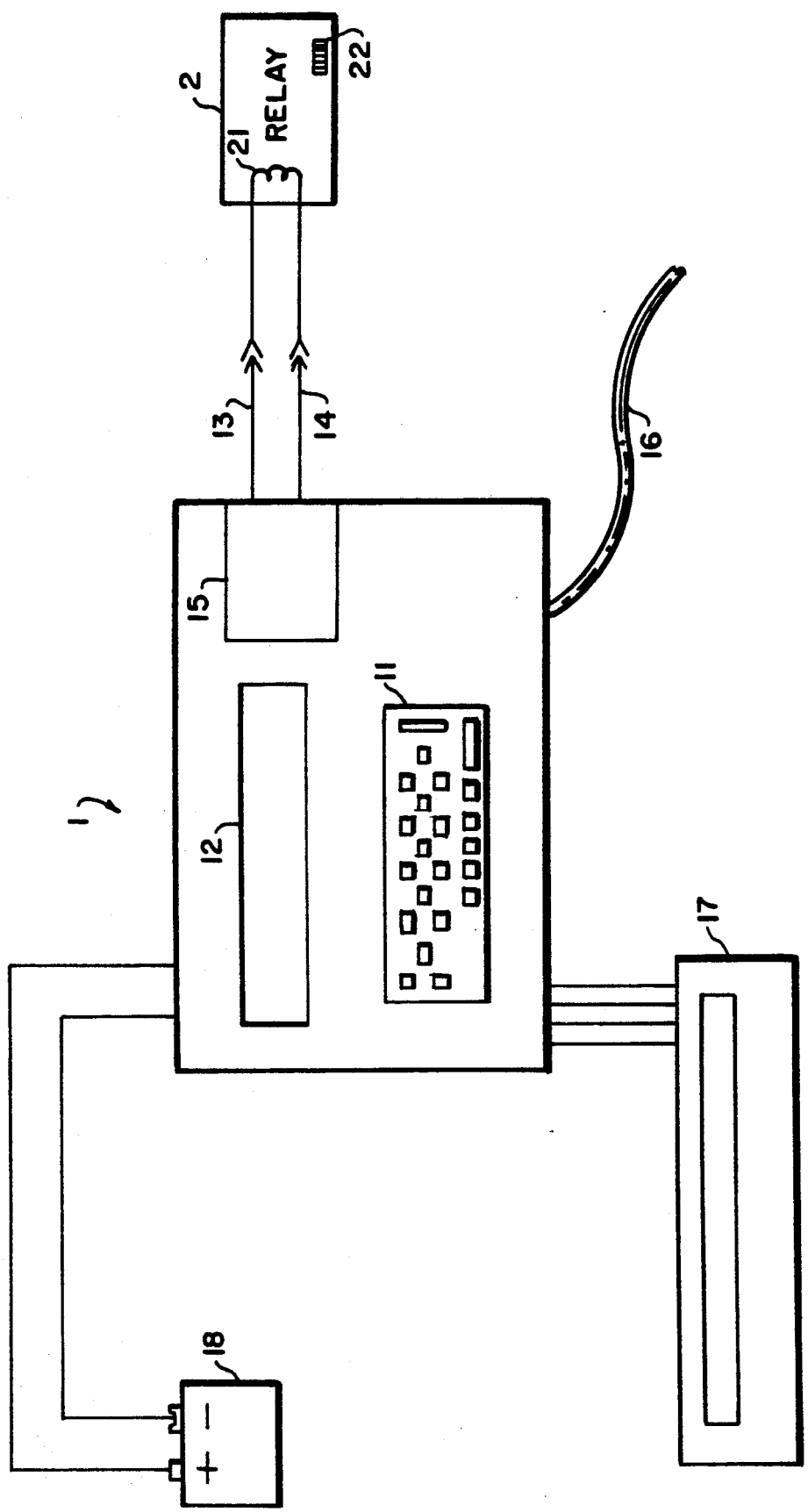
FIG. 1 reveals a portable version of the relay tester according to the present invention.

Referring first to FIG. 1, there is shown a portable computerized relay tester 1 which, according to the invention, is operable to automatically test the operation and performance of a relay under test, shown for example at 2. The relay tester 1 includes a computer having a keyboard 11 for inputting data to the computer and a display 12 for displaying test results. Electrical connectors 13, 14 are provided for establishing an electrical circuit between a relay coil 21 provided in the relay 2 and test circuitry 15 provided in the tester 1. (The test circuitry 15 will be more fully described with reference to FIGS. 2 and 3 below.) Additionally, the tester includes a bar code reader 16 for reading bar code labels (shown, for example, at 22) provided on the relays to be tested, and a printer 17 for printing out the results of the relay test. The entire tester 1, including the printer 17, is powered by a battery 18 and is thus portable.

According to the invention, the relay test procedure using the tester 1 is performed as follows:

In order to test, for example, a railroad signal relay, the tester 1 is transported to the location of the relay 2 adjacent the train tracks. The relay coil 21 is then connected to the tester 1 via the connectors 13, 14 and the bar code label 22 is read via the bar code wand 16 to determine the type of relay being tested. The computer then initiates testing of the relay (either automatically or at the prompting of a keyboard input from an operator) by activating the test circuitry 15. The test circuitry is effective to produce signals indicative of the actual "pickup" and "drop away" voltages or currents of the relay (as will be described below). The computer also retrieves reference "pickup" and "drop away+ voltages or currents from memory which represent acceptable and ideal values for these voltages or currents for the particular type of relay under test. (It is noted that the computer memory contains these acceptable and ideal values for up to 200 or more different kinds of relays.) Thereafter, the computer compares the indicated (i.e. actual) "pickup" and "drop away" voltages or currents with the reference "pickup" and "drop away" voltages or currents to determine the operability and/or performance of the relay under test. If it is found that the indicated "pickup" and "drop away" voltages or currents lie within the acceptable range of voltages or currents (as determined from the retrieved reference values) then the computer displays a "Pass" or similar indication. Otherwise, if the indicated voltages or currents do not lie within the acceptable range, then the computer displays a "Fail" or similar indication. Moreover, the printer 17 is then activated by the tester 1 so as to provide a tamper proof record of all test results (including e.g. the actual and reference voltage or current values, and other pertinent information such as the test date). If desired, for relay testing in the railroad industry, the printer 17 can be controlled to fill out the requisite preprinted or computerized regulatory forms used by the Department of Transportation with all the necessary test information.

Figure 2:
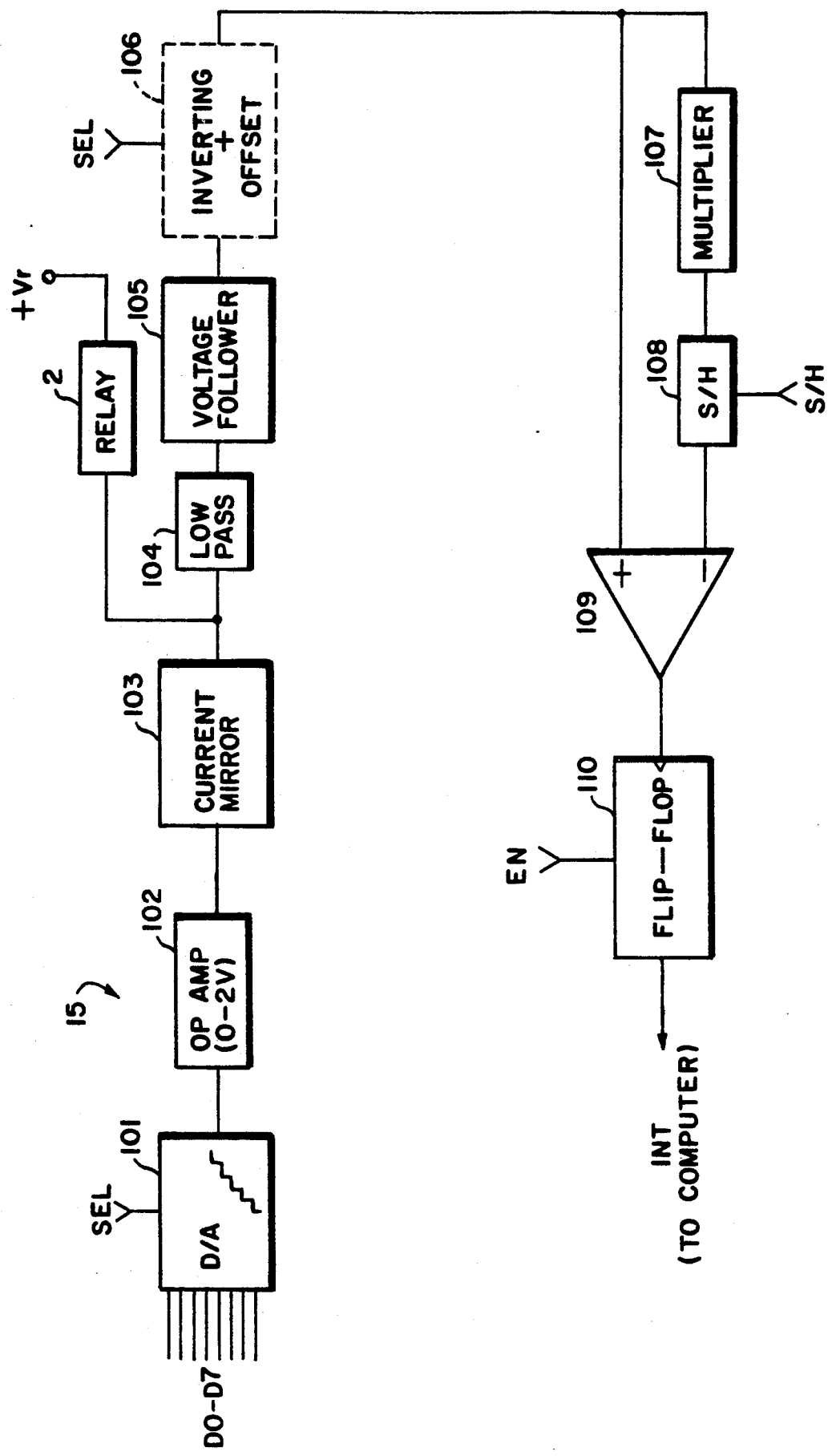
FIG. 2 reveals a diagrammatic representation of the test circuitry provided in the relay tester of FIG. 1.

Referring now to FIG. 2, there is shown a diagrammatic representation of the test circuitry 15. The circuitry comprises a digital to analog converter 101 which receives a series of data bytes over the lines D0 to D7 from the computer and converts these data bytes into a gradually changing voltage ramp (e.g. having 256 steps). The D/A converter 101 is configured to produce a gradually decreasing voltage ramp when the SEL[ect] input is at a low voltage level and to produce a gradually increasing voltage ramp when the SEL input is at a high level. (The SEL input is controlled to be "high" when it is desired to measure the relay's "pickup" voltage and to be "low" when it is desired to measure the relay's "drop away" voltage. In the preferred embodiment, the SEL input is controlled automatically by the computer, thereby permitting the automatic measurement of both the "pickup" and "drop away" voltages during a relay test. Of course, the SEL input could be manually controlled if it were desired to measure only one of the "pickup" and "drop away" voltages.)

The maximum output level of the D/A converter 101 is adjustable (via a variable resistor shown in FIG. 4). The output of the D/A converter is amplified in the operational amplifier 102 so that the output level of the operational amplifier 102 varies between 0 and 2 volts as the output of the D/A converter 101 varies between 0 and its maximum output level (through the 256 steps).

The output current of the operational amplifier is then fed into a current mirror 103 (which functions as a current controlled voltage source by limiting the flow of current through the relay). The output of the current mirror 103 is connected to one side of the relay 2 under test. The other side of the relay 2 is supplied with a relay voltage Vr (e.g. +24 V). Additionally, the output of the current mirror 103 is filtered through a low pass filter 104 and is buffered in a voltage follower 105.

When the SEL input is low, the inverting and offset circuit 106 is bypassed (through a switching circuit shown at 106s in FIG. 3) and the output of the voltage follower 105 is connected directly to the input of the voltage multiplier 107 and the (+) input of the comparator 109. On the other hand, when the SEL input is high, the output of the voltage follower 105 is fed into the inverting and offset circuit 106 (in order to cause the voltage increase in the multiplier to be in the same sense or direction as the voltage "spike" caused by the "drop away", as will be explained below). In this instance, when the SEL input is high, the output of the inverting and offset circuit 106 is connected to the input of the multiplier 107 and the (+) input of the comparator 109.

The voltage multiplier 107 produces a voltage gain of e.g. approximately 1.1 between its input and output. The output of the voltage multiplier 107 feeds a sample-and-hold circuit 108. The sample-and-hold circuit 108 is activated momentarily (at least when the INT[errupt] signal described below is not activated) to sample the voltage of the multiplied ramp input thereto and to hold it for a time period equal to (or approximately equal to) the time period between the aforementioned digital pulses which the computer sends to the D/A converter 101. The output of the sample-and-hold circuit 108 is fed into the (−) input of the comparator 109.

The comparator 109 compares the voltage presented at its first or (+) terminal with the voltage presented at its second or (−) terminal and provides an output to a SET input of the flip-flop 110. The voltage applied to the (+) terminal of the comparator 109 constitutes a first signal representative of an actual voltage potential being developed across the relay. The voltage applied to the (−) terminal of the comparator 109 constitutes a reference signal, wherein the reference signal is generated from the first signal by amplifying the first signal and then subjecting the amplified signal to a holding period before it is fed to the comparator 109. In this manner, the reference signal is given a waveform characteristic which both lags a corresponding waveform characteristic of the first signal by a time period equal to the holding time period of the sample-and-hold circuit 108 and is greater in amplitude than the corresponding waveform characteristic of the first signal by a factor equal to the gain (e.g. 1.1) of the multiplier 107.

When the voltage presented at the (−) terminal of the comparator 109 is greater than that presented at the (+) terminal, as will be the case when the armature of the relay has not shifted, then the output of the comparator 109 will remain low. (The time period of the sample and hold circuit 108, the gain of the multiplier 107, and the maximum percentage rate of increase and/or decrease of the voltage ramp produced by the D/A converter 101 are all chosen to ensure that, unless the armature of the relay 2 has shifted, the magnitude of the reference signal will e.g. always be greater than that of the first signal.) Therefore, in this condition, the flip-flop 110 will not be triggered and the INT signal will not be produced. On the other hand, when the voltage presented at the (+) input terminal of the comparator 109 is greater than that presented at the (−) input terminal thereof, as will be the case when the armature of the relay has shifted so as to cause a voltage "spike" (representing "pickup" or "drop away") to occur, then the output of the comparator 109 will change to a high level. The high output level of the comparator 109 will cause the flip-flop 110 to be SET (or triggered), and the output of the flip-flop 110 will switch to a high level, thereby producing the INT signal. The INT signal is thus fed to the computer.

Figure 3A:
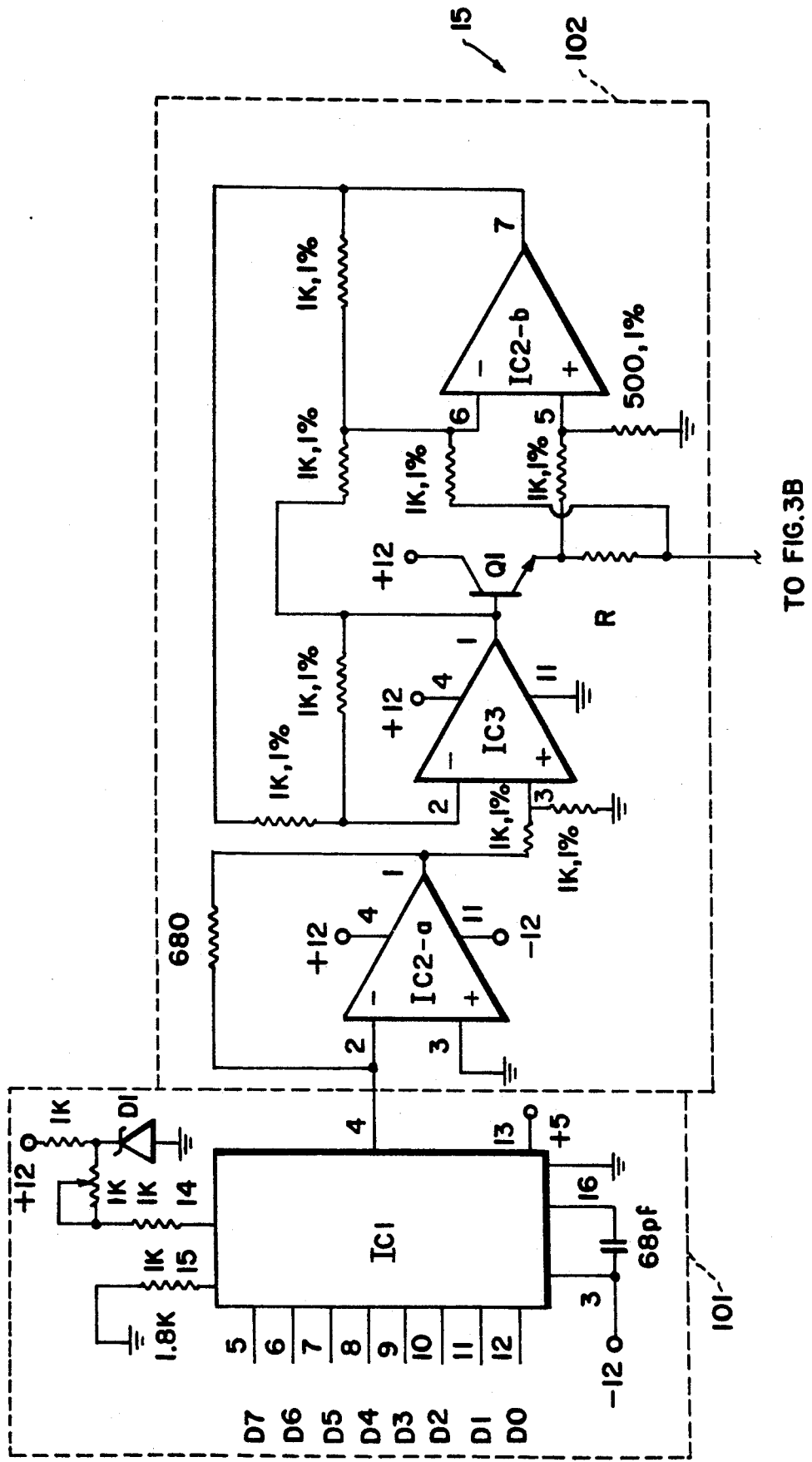
FIGS. 3A and 3B reveal a schematic representation of the test circuitry provided in the relay tester of FIG. 1.
Figure 3B:
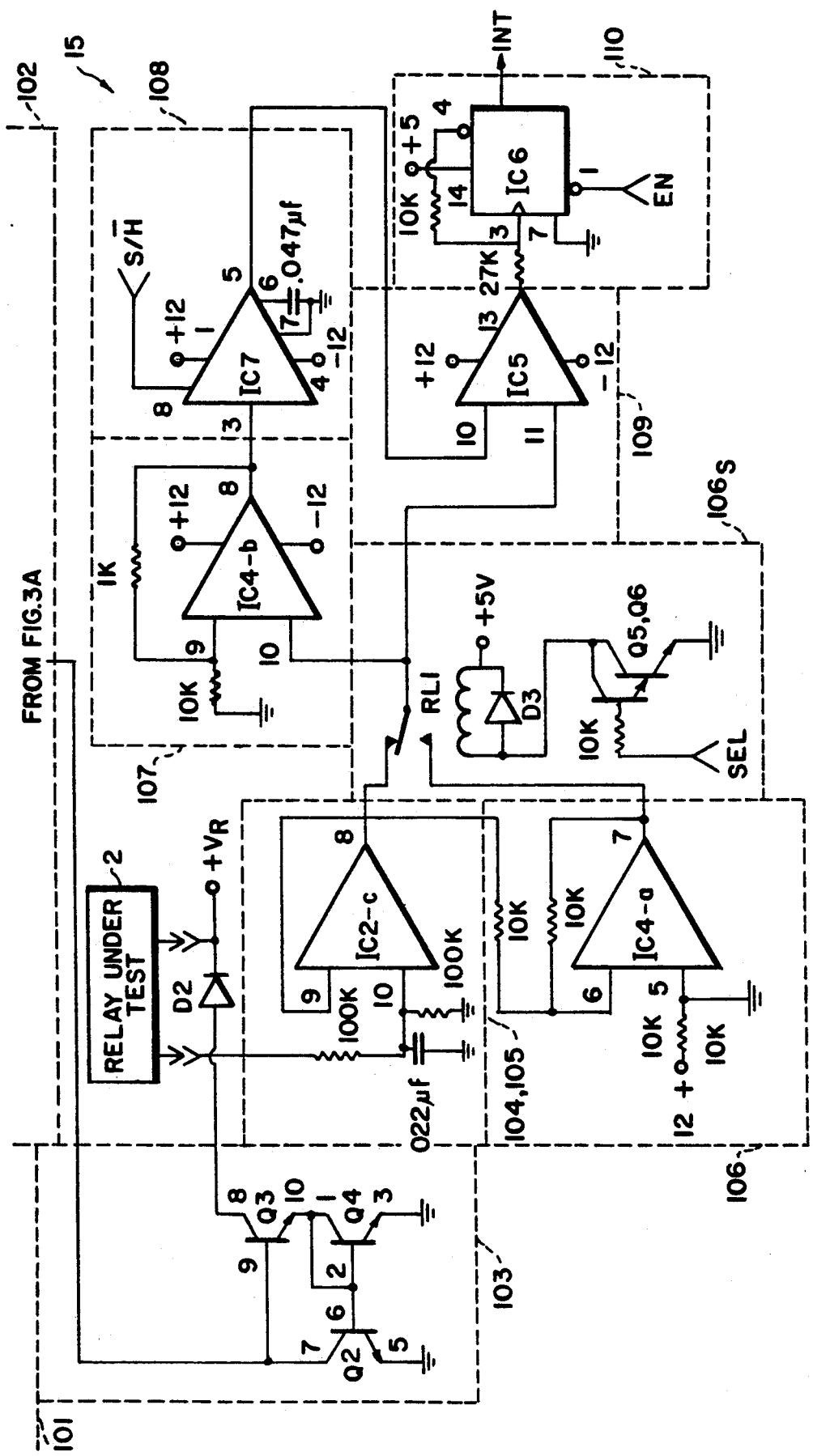

FIG. 3 reveals a schematic representation of the test circuit shown diagrammatically in FIG. 2, with like reference numerals referring to like parts in each of these Figures. The following list details the particular parts which were used in the test circuit represented by FIG. 3:

Q1: D42C1
Q2,Q3,Q4: MPQ2222 (quad 2N2222)
Q5,Q6: 2N2222
D1: 5.1V Zener diode
D2,D3: 1N4001
RL1: Single pole, double throw 5V reed relay
IC1: MC1508
IC2,IC3,IC4: LM324
IC5: LM339
IC6: 74LS74
IC7: LF398

All resistors (except $R_{cm}$) 1/4W, 5% unless otherwise indicated.

$R_{cm}$: 1/2W (for currents up to 250 mA) or 1W (for currents between 250 mA and 500 mA), 1%
S/H, EN, INT, SEL, D0-D7: TTL compatible.

The manner in which the computer in the tester 1 controls the actual testing of the "pickup" and "drop away" voltages will now be explained and reference may be had to FIG. 3 and the computer pseudocode appended hereto.

In order to measure the "pickup" current of a relay, a low (e.g. 12) data byte is output to the D/A converter 101, the SEL input is set high, and a low level signal is applied to the EN[able] input of the flip-flop 110 to clear the flip-flop. A high pulse (e.g. having a duration of 16 ms) is then applied to the S/H input of the sample-and-hold circuit 108 to sample and hold the output signal voltage from the multiplier 107. Next, a high level signal is applied to the EN input of the flip-flop 110. Then, while the output signal INT of the flip-flop is low, the computer causes the data byte supplied to the D/A converter 101 to be progressively incremented e.g until the output signal INT of the flip-flop becomes high. That is, the computer increments the data byte from e.g. 12 to e.g. 255, with a predetermined time delay (e.g. 6 ms) between each increment, until it is determined that "pickup" has occurred. In order to determine the occurrence of "pickup", the computer checks the level of the output signal INT shortly (e.g. 5 ms) after each increment. If "pickup" has occurred since the last increment, INT will be high (since the high output signal of the comparator 109 will have set the flip-flop 110). The computer will respond to the high level INT signal by storing the databyte corresponding to "pickup" and thereafter calculating the "pickup+ current according to the relation:

*Pickup Current* $=((Data\ Byte\ Value/128)/R_{cm}$ wherein $R_{cm}$ is the resistance of the current mirror resistor $R_{cm}$ shown in FIG. 3. On the other hand, if "pickup" has not occurred since the last increment, then the computer sends a high pulse (e.g. having a duration of 1 ms) to the S/H input of the sample- and-hold circuit 108 (to sample and hold a present value of the multiplied ramp signal output by the multiplier 107) and thereafter continues to progressively increment the data byte supplied to the D/A converter 101 as described above.

After sensing the high level INT signal and calculating the "pickup" current, the computer then causes the "pickup" current to be displayed and printed out by the printer 17 e.g. on a requisite relay test form. The computer then automatically proceeds to measure the "drop away" current.

In order to measure the "drop away" current of a relay, a high databyte (e.g. The databyte which corresponds to the determined pickup current level) is output to the D/A converter 101, the SEL input is set low, and a low level signal is applied to the EN input of the flip-flop 110 to clear the flip-flop. A high pulse (e.g. having a duration of 500 ms) is then applied to the S/H input of the sample-and-hold circuit 108 to sample and hold the output signal voltage from the multiplier 107. Next, a high level signal is applied to the EN input of the flip-flop 110. Then, while the output signal INT of the flip-flop is low, the computer causes the data byte supplied to the D/A converter 101 to be progressively decremented e.g until the output signal INT of the flip-flop becomes high. That is, the computer decrements the data byte from the high level to e.g. zero, with a predetermined time delay (e.g. 6 ms) between each increment, until it is determined that "drop away" has occurred. In order to determine the occurrence of "drop away", the computer checks the level of the output signal INT shortly (e.g. 5 ms) after each increment. If "drop away" has occurred since the last increment, INT will be high (since the high output signal of the comparator 109 will have set the flip-flop 110). The computer will respond to the high level INT signal by storing the databyte corresponding to "drop away" and thereafter calculating the "drop away" current according to the relation:

$$Drop\ Away\ Current = ((Data\ Byte\ Value/128)/R_{cm}.$$

On the other hand, if "drop away" has not occurred since the last increment, then the computer sends a high pulse (e.g. having a duration of 1 ms) to the S/H input of the sample-and-hold circuit 108 (to sample and hold a present value of the multiplied ramp signal output by the multiplier 107) and thereafter continues to progressively decrement the data byte supplied to the D/A converter 101 as described above.

After sensing the high level INT signal and calculating the "drop away" current, the computer then causes the "drop away" current to be displayed and printed out by the printer 17 e.g. on the requisite relay test form.

The sensitivity of the tester may be easily adjusted by modifying the gain of the multiplier 107. For example, if increased sensitivity is desired, then it would be advantageous to employ a multiplier having a gain of 1.05. However, it may then be necessary to begin the "pickup" current test by outputting a slightly higher data byte (e.g. 25) to the D/A converter 101.

While the present invention has been described with certain particularity, it is not meant to be limited to the above described embodiment. The invention shall therefore encompass the described embodiment and any modifications thereof which will fall within the scope of the appended claims.

What is claimed is:

1. A relay tester for sensing a shifting of a relay armature in a relay under test, comprising:
   applying means for applying a ramped, time varying voltage potential to the relay;
   first signal generating means for generating a first electrical signal representative of an actual voltage potential being developed across the relay while the ramped, time varying voltage potential is being applied;
   reference signal generating means for modifying the first signal to generate a reference signal, wherein the generated reference signal has a waveform characteristic which both lags a corresponding waveform characteristic of the first signal by a predetermined time period and is greater in amplitude than the corresponding waveform characteristic of the first signal; and
   voltage spike determining means, responsive to the first electrical signal and the reference electrical signal, for producing an output signal indicative of the shifting of the relay armature when magnitude of the first electrical signal passes a magnitude of the reference electrical signal, thus indicating an occurrence of an inductive voltage spike.

2. A relay tester as recited in claim 1, wherein the voltage spike determining means comprises a comparator, and wherein a first input of the comparator receives the first electrical signal and a second input of the comparator receives the reference electrical signal, and the output signal is produced when the magnitude of first electrical signal exceeds the magnitude of the reference electrical signal.

3. A relay tester as recited in claim 2, wherein the reference signal generating means comprises:
   multiplier means for multiplying a voltage potential of the first electrical signal; and
   sample-and-hold means for sampling an output signal of the multiplier means and for holding a voltage potential corresponding to a voltage potential of the sampled output signal;
   wherein second input of the comparator receives the voltage potential held in the sample and hold means.

4. A relay tester as recited in claim 2, wherein the applying means comprises:
   digital to analog converter means for receiving a series of data bytes from a computer and for generating, in response to each of the data bytes, an output signal having a magnitude proportional to a value of the data byte;
   amplifier means for amplifying the output signal of the digital to analog converter; and
   a current mirror connected to the amplifier means;
   wherein an output signal of the current mirror generates the ramped, time varying voltage potential which is applied to the relay.

5. A relay tester as recited in claim 4, wherein filter means are provided for filtering the output signal of the current mirror, and wherein the filter means comprise:
   a low pass filter; and
   a voltage follower connected in series with the low pass filter, wherein an output signal of the voltage follower is fed to the first input terminal of the comparator.

6. A relay tester as recited in claim 5, wherein the series of data bytes is generated by the computer in such a manner that the series of data bytes alternately constitutes data bytes which increase in value and data bytes which decrease in value, and wherein, when the computer generates the series of data bytes which increase in value, switch means are provided for connecting an inverting circuit in series connections between an output of the voltage follower and the first input terminal of the comparator and between the output of the voltage follower and the multiplier means.

7. A relay tester as recited in claim 1, wherein the relay tester further comprises:
   connection means including electrical connectors for selectively establishing an electrical circuit between the applying means and the relay during the test; and
   display means for graphically displaying information relating to an actual condition of the relay as indicated by the output signal of the voltage spike determining means once the test is completed.

8. A relay tester as recited in claim 7, wherein the relay tester is provided with reader means for reading informational indicia provided on the relay.

9. A relay tester as recited in claim 8, wherein the reader means comprises a bar code reader.

10. A relay tester as recited in claim 8, wherein the relay tester comprises a computer provided with memory, and retrieval means are provided for retrieving specific reference information from the memory relating to an acceptable condition of the relay on the basis of the informational indicia read by the reader means.

11. A relay tester as recited in claim 10, wherein determination means are provided for determining whether the actual condition of the relay is acceptable based on the specific reference information retrieved from the memory, and for outputting to the display means a signal indicative of whether or not the actual condition of the relay is acceptable.

12. A relay tester as recited in claim 10, wherein means are provided for displaying the specific reference information retrieved from the memory by the retrieval means on the display means.

13. A relay tester as recited in claim 11, further comprising a printer means for printing out a physical record of the actual condition of the relay as determined by the test.

14. A relay tester as recited in claim 13 wherein the printer means is configured so as to provide the physical record on a preprinted form.

15. A relay tester as recited in claim 13, wherein the relay tester is portable and is powered by a battery.

16. A method of testing a relay comprising:
applying a ramped, time varying voltage potential to the relay;
generating a first electrical signal representative of an actual voltage potential being developed across the relay while the ramped, time varying voltage potential is being applied to the relay;
generating a reference electrical signal from the first electrical signal by feeding the first electrical signal through a multiplier and a sample-and-hold circuit to produce the reference electrical signal, whereby, in the time domain, a waveform characteristic in the reference electrical signal caused by the shifting of the relay armature lags a corresponding waveform characteristic in the first electrical signal by a predetermined period;
producing an output signal indicative of the shifting of the relay armature when the value of the first electrical signal passes the value of the reference electrical signal, thus indicating an occurrence of a voltage spike.

* * * * *